(12) United States Patent
Nayak et al.

(10) Patent No.: US 7,376,939 B1
(45) Date of Patent: May 20, 2008

(54) SYSTEM FOR ARCHITECTURE AND RESOURCE SPECIFICATION AND METHODS TO COMPILE THE SPECIFICATION ONTO HARDWARE

(75) Inventors: Anshuman Nayak, Schaumburg, IL (US); Malay Haldar, Schaumburg, IL (US); Alok Choudhary, Chicago, IL (US); Vikram Saxena, Schaumburg, IL (US); Prithviraj Banerjee, Glenview, IL (US)

(73) Assignee: Xilinx, Inc., San Jose, CA (US)

( * ) Notice: Subject to any disclaimer, the term of this patent is extended or adjusted under 35 U.S.C. 154(b) by 722 days.

(21) Appl. No.: 10/072,212

(22) Filed: Feb. 7, 2002

(51) Int. Cl.
*G06F 9/45* (2006.01)
*G06F 9/455* (2006.01)
*G06F 17/50* (2006.01)
*G06F 7/62* (2006.01)
*G06F 9/44* (2006.01)

(52) U.S. Cl. ............ 717/144; 717/136; 717/138; 717/139; 717/140; 717/114; 717/146; 713/13; 713/23; 716/1

(58) Field of Classification Search ............ 717/114, 717/136–140, 143, 144, 146; 716/1–18; 703/13–28
See application file for complete search history.

(56) References Cited

U.S. PATENT DOCUMENTS

| | | | |
|---|---|---|---|
| 5,706,434 A * | 1/1998 | Kremen et al. ............ 395/200 |
| 6,233,540 B1 * | 5/2001 | Schaumont et al. ......... 703/14 |
| 6,718,520 B1 * | 4/2004 | Merryman et al. ........... 716/1 |
| 6,857,110 B1 * | 2/2005 | Rupp et al. .................... 716/4 |
| 2002/0038401 A1 * | 3/2002 | Zaidi et al. .................... 716/1 |
| 2003/0105620 A1 * | 6/2003 | Bowen ......................... 703/22 |
| 2004/0013210 A1 * | 1/2004 | Bollano et al. ............. 714/786 |

OTHER PUBLICATIONS

Smith, et al., "An Architecture Design and Assessment System for Software/Hardware Codesign", IEEE, 1985, pp. 417-424.*

* cited by examiner

*Primary Examiner*—William Wood
(74) *Attorney, Agent, or Firm*—Fernandez & Associates LLP.; Robert M. Brush

(57) ABSTRACT

Electronic design automation tool specifies an architecture at a system level and its component (which include intellectual property (IP) cores like embedded processors, arithmetic logic units (ALU), multipliers, dividers, embedded memory element, programmable logic cells, etc.); specifies IP-cores and their interface; and understands IP-cores and functions via their interface. Further, techniques are provided for modeling the timing behavior of a function or functional block without drawing a timing diagram; understanding the interface behavior of a function block which captures the timing waveforms; specifying virtual functions which are built using basic functional units and their timing behavior; parsing and creating an internal graphical form for analyzing a specification for compilation; matching the components in the architecture specification and their instantiation to map the computations in the input graph produced from an application; and mapping the specification onto the target's components.

20 Claims, 11 Drawing Sheets

FIGURE 2a

```
/////////////////////////////////
// Declaration of a pipelined 16 x 16 //
// unsigned multiplier              //
/////////////////////////////////

RESOURCEDEF MULT16x16_FULLPIPE_UNSIGNED
{
    /////////////////////////////
    //  A Multiplier          //
    /////////////////////////////
    FUNCTIONALITY MULT;

/////////////////////////////
    // The intantiation code for a //
    // specific multiplier     //
    /////////////////////////////
    ATTRIBUTE INSTANTIATION
    {
        /////////////////////////////////////
        // component_name is the specific soft IP //
        // instance that needs to be accessed    //
        /////////////////////////////////////
        attribute +
            "input wrap unsigned fixed[16,0] " + component_name + "_A;\n" +
            "input wrap unsigned fixed[16,0] " + component_name + "_B;\n" +
            "output wrap unsigned fixed[32,0] " + component_name + "_R;\n";

attribute +
```

```
            "instantiate mult16x16_fullpipe_unsigned : " + component_name +
        "(" +     "A = " + component_name + "_A," +
                "B = " + component_name + "_B," +
                "clk = " + clock_name + "," +
                "clr = " + reset_name + "," +
                "R = " + component_name + "_R" +
            ");";
    }

//////////////////////////////////////
    //  Whether the Soft IP core can    //
    //  perform the multiplication      //
    //////////////////////////////////////

ATTRIBUTE CAN_DO
    {
      <MULT>
        {
            if(in1->bitwidth() < 17 && in2->bitwidth() < 17 &&
              in1->is_unsigned() == true && in2->is_unsigned() == true)
            {
              attribute + "true";
            }
            else
            {
              attribute + "false";
            }
        }
    }
```

Figure 2b

```
/////////////////////////////////
// The Pipeline latency. I.e. the  //
// number of clock cycles after   //
// which new data can be fed to the //
// pipelined multiplier           //
/////////////////////////////////

ATTRIBUTE PIPE_DELAY
{
    <MULT>
    {
        attribute + "1";
    }
}

/////////////////////////////////
// Is this a Combinatorial multiplier //
// or a Sequential multiplier. This   //
// decides if this multiplier can be  //
// chained or not                     //
/////////////////////////////////

ATTRIBUTE COMBINATIONAL
{
    <MULT>
    {
        attribute + "false";
    }
``` figure 2C

```
//////////////////////////////
// The multiplier latency. I.e. the    //
// number of clock cycles after        //
// which processing is over            //
//////////////////////////////

ATTRIBUTE NUM_STATES
{
  <MULT>
   {
       attribute + "6";
   }
}

//////////////////////////////
// Interface access mechanism wherein //
// we have fixed latency of 6 clock   //
// cycles with a throughput of 1      //
//////////////////////////////

ATTRIBUTE INTERFACE
{
  <MULT>
   {
      attribute + "state1: {";
      attribute + component_name + "_A = " + in1->name() + " ; \n";
      attribute + component_name + "_B = " + in2->name() + " ; \n";
```

Fig 2d attribute + "goto state2 ;\n";

attribute + "}";

attribute + "state2: {";

attribute + "goto state3 ;\n";

attribute + "}";

attribute + "state3: {";

attribute + "goto state4 ;\n";

attribute + "}";

attribute + "state4: {";

attribute + "goto state5 ;\n";

attribute + "}";

attribute + "state5: {";

attribute + "goto state6 ;\n";

attribute + "}";

attribute + "state6: {";

attribute + out1->name() + " = " + component_name + "_R ; \n";

attribute + "goto NEXTSTATE ;\n";

attribute + "}";

```
//////////////////////////////////
// Declare a new functionality   //
// which accumulates data        //
//////////////////////////////////

FUNCTIONALITYDEF ACCUMULATE {

INPUT a,over;
    OUTPUT q;

ADD adder;

DCONNECT(a,adder->in1);
    DCONNECT(adder->out1,adder->in2);
}

//////////////////////////////////
// Declaration of a accumulator with a //
// variable latency             ///
//////////////////////////////////

RESOURCEDEF ACCUMULATOR_VAR_LATENCY
{
    //////////////////////////////////
    // An Accumulator              //
    //////////////////////////////////
    FUNCTIONALITY ACCUMULATE;
```

Figure 3a

```
//////////////////////////////
// The adder latency is variable. In //
// that case, this marks the number  //
// of states in the interface code   //
//////////////////////////////

ATTRIBUTE NUM_STATES
{
   attribute + "2";
}

//////////////////////////////
// Interface access mechanism wherein //
// we have variable latency           //
//////////////////////////////
ATTRIBUTE INTERFACE
{
    attribute + "state1: {";
    attribute + "if(" + over->name() + " = '1'){\n" +
              "goto NEXTSTATE;}\n";
      attribute + "else { " +
              "goto state2;}\n";
    attribute + "}";
      attribute + "state2: {";
    attribute + q->name() + "=" + q->name() + "+" + a->name() + ";";
      attribute + "}\n";
  }
}
``` figure 3b

///////////////////////////////////
// Declare a new functionality    //
// which accumulates N data       //
///////////////////////////////////

FUNCTIONALITYDEF ACCUMULATE {

INPUT a,N;
OUTPUT q;

ADD adder;

DCONNECT(a,adder->in1);
DCONNECT(adder->out1,adder->in2);
}

///////////////////////////////////
// Declaration of a accumulator with a //
//   variable latency            ///
///////////////////////////////////

RESOURCEDEF ACCUMULATOR_VAR_LATENCY
{
///////////////////////////////
//  An Accumulator           //
///////////////////////////////
FUNCTIONALITY ACCUMULATE;

Figure 4a

```
//////////////////////////////
// The adder latency is variable and //
// is equal to N where N is an input //
// port of the ACCUMULATE function   //
//////////////////////////////

ATTRIBUTE NUM_STATES
{
  attribute + "1";
}

//////////////////////////////
// Interface access mechanism wherein
// we have variable latency         //
//////////////////////////////

ATTRIBUTE INTERFACE
{
    attribute + "state1: {";
    attribute + "for(i = 0;i < " +
                N->name() + ";i = i + 1){";
    attribute + q->name() + "=" + q->name() +
                " + " + a->name() + ";}\n";
    attribute + "goto NEXTSTATE;\n";
    attribute + "}\n";
  }
}
```

Figure 4b a = x * y + z
(i)
a = z + x * y
(ii)
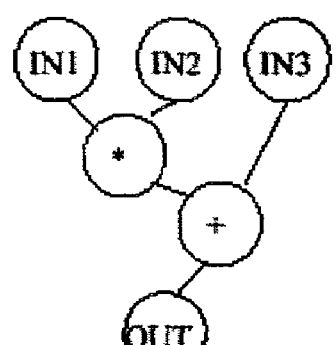
(a)
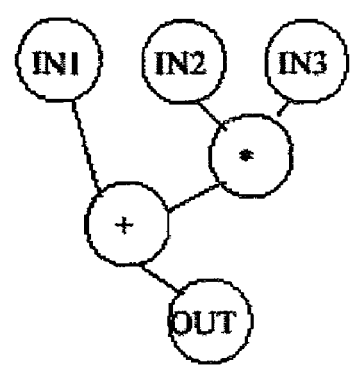
(b)
Figure 5

SYSTEM FOR ARCHITECTURE AND RESOURCE SPECIFICATION AND METHODS TO COMPILE THE SPECIFICATION ONTO HARDWARE

FIELD OF INVENTION

The invention relates generally to electronic design automation and computer-aided tools, particularly for high-level synthesis onto Field Programmable Gate/Logic Arrays (FPGAs), platform FPGAs, Programmable Logic Devices (PLDs), Configurable Programmable Logic Devices (CPLDs), Systems on programmable Chips (SoPC) and Application Specific Integrated Circuits (ASICSs) in a retargetable manner (these and similar devices and platforms are referred as "target" in this document). In particular, this field of invention is a specification and process to compile the description of a system architecture in a language-independent manner to enable retargetable high-level synthesis.

BACKGROUND OF INVENTION

High-level synthesis of applications specified using behavioral description in high-level languages (such as MATLAB etc.) onto targets depends on the architecture specific details of the target. Architecture-specific details may include configuration and layout of the target device, memory organization, interconnection organization and protocols, embedded functional units and their numbers and capabilities, control configurations and requirements, etc. Therefore, a compiler or a tool, which takes a high-level specification of the application as input for synthesis on a particular target architecture has to be specific to the architecture. Accordingly, there is a need for an improved approach to specify or compile design information.

SUMMARY OF INVENTION

The invention is manifested in a computer apparatus, interface specification, and/or software-implemented method for (1) specifying an architecture at a system level and its component (which include intellectual property (IP) cores like embedded processors, arithmetic logic units (ALU), multipliers, dividers, embedded memory element, programmable logic cells, etc.,) (2) specifying IP-cores and their interface, (3) understanding IP-cores and functions via their interface, (4) a method and process for modeling the timing behavior of a function or functional block without drawing a timing diagram, (5) a method and process for understanding the interface behavior of a function block which captures the timing waveforms, (6) a method and process for specification of virtual functions which are built using basic functional units and their timing behavior, (7) parsing and creating an internal graphical form for analyzing a specification for compilation, (8) matching the components in the architecture specification and their instantiation to map the computations in the input graph produced from an application, and (9) mapping the specification onto the target's components. IP cores are normally highly optimized function or computation blocks at different levels. For example, at a high-level, a library function for a filter operation (e.g., FFT) can be considered an IP block, and at a low-level structural, or register transfer level (RTL) hardware description language (HDL) on a particular platform with a well-defined interface can be considered an IP-core (or block). Certain platforms contain embedded IP cores (e.g. different type of multipliers in a system which also contains an FPGA part).

The invention may reside in specifying the architecture of targets in a hierarchical manner to permit levels of refinement. In particular, the invention may reside in specifying components and their characteristics, their interfaces and timing behavior at a high-level, and their integration within a design in the application synthesis process. Also, the invention may reside in processing the architecture and component specification into an internal graph representation, which describes the capabilities and connectivity of the components. Also, the invention may reside in mapping the application written in high-level language onto the components by performing graph matching. Also, the invention may reside in specifying and processing the interface of the library functions (or IP-cores). Also, the invention may reside in identifying and processing the most suitable IP-core component to incorporate into the produced output design.

Generally, the invention provides a way to describe and specify the target architecture to the compiler in such a manner that the compiler can become independent of the target architecture, and consequently, it only needs to understand the specification of the architecture. Then, the compiler can be easily retargeted to different architectures by specifying a different target architecture, and providing it as an input to the compiler. This invention describes a specification language and method for describing architectures at system level and a compiler of this specification, which can make synthesis tool retargetable by following the specified process.

Thus, as and when architectures are refined and new ones developed, a user does not have to recode the application to be synthesized onto the new target architecture, nor does the compiler need to be changed. As a simple example, suppose the current target architecture has four MAC units, which are utilized by the compiler to the fullest extent for parallelism. Now if the new target architecture has eight MAC units, the compiler can recompile the application quickly to exploit more parallelism without having to change the compiler itself.

Further, this invention describes a way to specify the functionality, interface and behavior of an IP-core as well as a mechanism and process to incorporate IP-cores within synthesis of an application onto the target. The IP-cores may be specified in any language. The method and process in this invention can incorporate the IP-cores within the design using the specified interface. Thus the invention makes the compilation process to incorporate the IP-cores independent of the language in which IP-core is specified, designed and implemented. That is, the process in this invention has the capability to understand the interface and incorporate IP-cores within the synthesized design.

Advantageously, this invention enhances the retargetability of the high-level synthesis tools by adapting the tools to different specifications of targets. Advantageously, this invention permits integration of different IPs (hard and soft) into a system specification. Furthermore, this invention provides a capability rapidly to evaluate new architectural features in future systems design, and evaluate the impact of the new features on the synthesized application's performance.

BRIEF DESCRIPTION OF DRAWINGS

FIG. 2(A-E) is an example of a pipelined multiplier and its interface specification including throughput and latency.

FIG. 3(A-B) is an illustration of declaring a function to accumulate data with a variable latency.

FIG. 4 (A-B) illustrates an accumulator specification and its interface using which N items can be accumulated, where N is an input parameter.

FIG. 5 is a sample dataflow graph.

DETAILED DESCRIPTION OF PREFERRED EMBODIMENT

Figure 1:
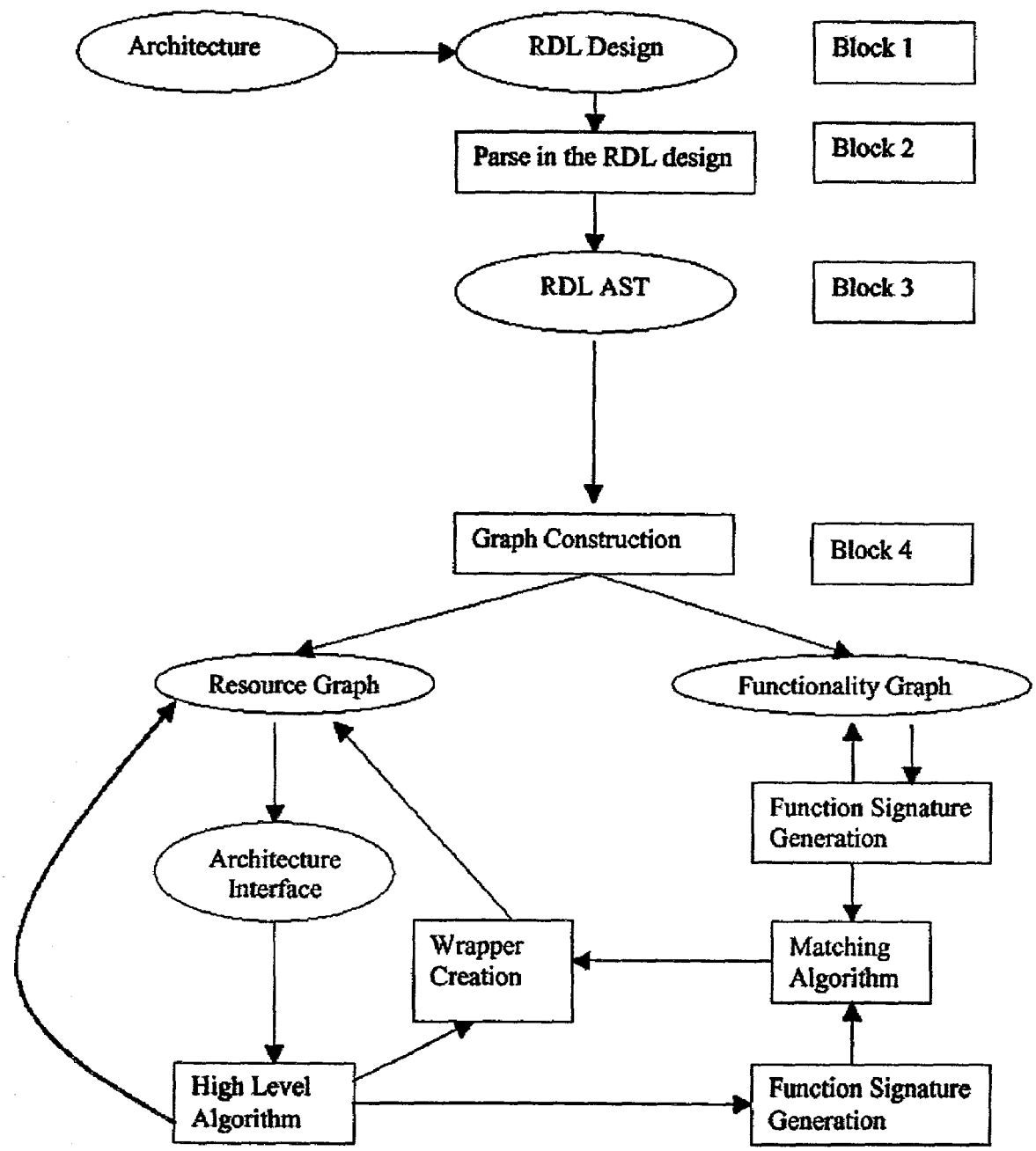
FIG. 1 is an overview of an embodiment of RDL processing. Ovals in the figure describe input, output or intermediate data structures; and rectangular blocks represent processing algorithm and transformations.

Generally, the resource definition language (RDL) is designed to specify target architectures and may represent one or more manifestation for embodying methods and processes described in this invention. RDL may represent a wide range of functionalities in a generic notion of the RESOURCE. Using such resource construct, a user specifies a wide variety of architectural resources, or specifies a new one by using the required interface. Constructs are provided to describe a hierarchical relationship between resources to aggregate multiple resources together to form larger resources. Along with a hierarchical relationship between resources, peer-to-peer relationships can also be specified as CONNECTIONS. A connection describes a link between two resources, via a third resource. The functionality of each resource can be extended, or new resources with new functionalities can be added. The ease of defining new functionalities and the ease to aggregate them to describe new architectures provides the power and flexibility to easily retarget to a different system or specify a new system.

A standard interface in the RDL may be used by a compiler to facilitate information flow between the compiler and the architecture. An Application Programming Interface (API) is provided for a compiler to query the information about the properties and features of the architectures.

Features and functionality of RDL are described herein to illustrate the use of RDL. RDL contains mechanisms to specify the structure of functions, infer the structure of components and functions specified in other languages (and therefore in a language independent manner), understand the interface and behavior of components and functions, understand the timing behavior of functions and components, and mechanisms to compile and synthesize based on the specifications.

FIG. 1 presents an overview figure describing an embodiment of RDL processing. The architecture of the target is presented as an input (Block 1). The design and features of the target are described using RDL (described later). RDL design is parsed and validated for syntax correctness. RDL design is then transformed into an Abstract Syntax Tree (AST), which stores the features, characteristics, interconnects of the components of the target (Block 2). The RDL may capture all current and future target architectures. Block 2 takes in as input a single RDL description of the target architecture and creates an intermediate graph representation of the architecture so as to perform optimizations. All required and important information about the target architecture to compile it can be inferred from the intermediate storage.

The RDL AST is used as an intermediate storage of information that was parsed in from the RDL file. The advantage is not only in ease of translation to the RDL graph, but also in ease of writing the RDL file (Block 3). This advantage is because the RDL file can have declarations of functions (through FUNCTIONALITYDEF) statements, of resources (through RESOURCEDEF) statements and units (through UNITDEF) statements and their usage in any order (i.e., the usage can precede definitions). RDL description is presented herein. Further, the RDL AST has information stored so that the translation pass is easy. Since the RDL file is a set of definitions, i.e., ParameterDef, FunctionalityDef, ResourceDef, and UnitDef, all information is stored in the RDL AST SymbolTable class. Further, the four classes of definitions are stored separately for ease of access.

Once the RDL file is parsed in and stored in an intermediate AST, the RDL graph creation pass traverses the RDL AST and outputs a C++ file, which when invoked by a high-level synthesis compiler, returns a graph of the target architecture. This graph comprises a list of target architecture resources (compute resource, communication resource and storage resource) and the interconnection between these resources. It also provides information on the possible usage of the resources (i.e., the functionalities supported) and the attributes associated with a resource. The functionalities are also specified in the form of a functionality graph.

Compilation and synthesis of an application entails generation of resource graphs and functionality graph. The resource graphs represent the available resources and their capabilities. The functionality graph represents the graph of the required functionality from the application. Both functionality and resource graphs have hierarchical nature, and one resource's functionality can subsume another. For example, a 16-bit adder also satisfies a requirement for a 15-bit adder, 14-bit adder, etc. A multiply-accumulate resource also satisfies requirements for a multiplier, or an adder or both.

In order to determine which function or operation from an application can be implemented using which resource, unique signatures are generated for both. Then if the signatures match, then the resource satisfies the required functionality. This matching is achieved using a graph-matching algorithm. Since multiple resources can satisfy the required functionality, and a single resource can satisfy multiple functionalities, the matching process entails optimized area-performance tradeoffs to achieve optimal performance and resource usage. At the end of this process, the application is compiled onto the target.

RDL provides basic operators shown in Table 1. The RDL compiler, whose functionality and embodiment is described later, is aware of the functionality specified by the operators in Table 1. These basic operators are an illustration of one embodiment of RDL, and may be used to demonstrate the examples and capabilities of certain aspects of this invention. The specification of these basic operators can be in any language as long as corresponding grammar is also provided for its compilation.

TABLE 1

Basic Operators in the Resource Description Language (RDL)

| Operator | Symbol | Arith/logic | Functionality |
|---|---|---|---|
| ADD | + | Arithmetic | Addition |
| SUB | − | Arithmetic | Subtraction |
| MULT | * | Arithmetic | Multiplication |
| DIV | / | Arithmetic | Division |
| REM | % | Arithmetic | Remainder |
| AND | && | Logical | And |
| OR | \|\| | Logical | Or |
| NOT | ! | Logical | Negation |
| XOR | xor | Logical | Exclusive OR |
| EQ | == | Logical | Equal to comparison |
| NEQ | != | Logical | Not equal to comparison |

TABLE 1-continued

Basic Operators in the Resource Description Language (RDL)

| Operator | Symbol | Arith/logic | Functionality |
|---|---|---|---|
| GT | > | Logical | Greater than comparison |
| LT | < | Logical | Less than comparison |
| GE | >= | Logical | Greater than or equal to |
| LE | <= | Logical | Less than or equal to |
| BAND | & | Logical | Bitwise and |
| BOR | \| | Logical | Bitwise or |
| BNOT | ~ | Logical | Bitwise negation |
| SLL | sll | Logical | Logical left shift |
| SLR | slr | Logical | Logical right shift |
| SLA | sla | Arithmetic | Arithmetic right shift |
| SRA | sra | Arithmetic | Arithmetic right shift |
| ROR | ror | Arithmetic | Rotate right |
| ROL | rol | Arithmetic | Rotate left |
| ABS | abs | Arithmetic | Absolute value |
| STORAGE | N/A | N/A | Can store data |
| TRANSPORT | N/A | N/A | Can transfer data |
| RECONFIG | N/A | N/A | Can be used to map logic |

These basic operators are used to convey the functionality implemented by a specific hardware unit. In addition, these operators can be aggregated together to construct more complex functionality (illustrated later) using the FUNCTIONALITY construct.

The last three functionalities in the list of basic operations shown in Table 1 are not arithmetic or logical operations. Rather, they are functionality provided by hardware units present in the architecture. For example, memory structures and registers provide the functionality STORAGE. Buses and ports provide the functionality TRANSPORT. An array of reconfigurable cells provide the functionality RECONFIG. A common description of all the basic functionalities provided by different components of the architecture enables each component to be part of the generic RESOURCE abstraction. The generic RESOURCE abstraction in turn makes description of existing and future architectures easy by providing a unified view of the whole architecture.

Note that the above list is not exhaustive. Newer functionality may be added to this list, which can correspond to more complex functions. The synthesis tool using the RDL to understand the IP interface and the target architecture can then infer the complex function as a basic block and automatically infer it during high-level synthesis. For example, we may define the FFT as a functionality, which the compiler can be enhanced to understand. This inference may enable the use of IP blocks performing FFTs as a basic building block, which can be inferred from system-level descriptions of an application.

Generally, basic operators, keywords and operators are used together to describe an architecture. The structure in described in a top-down manner. The starting step is with the concept of a UNIT that is composed of other UNITs or RESOURCEs. Each RESOURCE is a basic hardware structure that provides a set of functionalities, and has a set of properties.

For the purpose of describing syntax used within an RDL description, the following conventions are used:
1. Entities surrounded by angular brackets (<string>), denote names or character strings that have to be put in the actual use of the keyword.
2. list_of[entities] denote that in the actual use of the keyword, a list of entities specified within the square brackets may exist.
3. %entity% denotes that the entity between % % is optional while using the keyword.
4. INTEGER refers to a positive non-zero integer;
5. OR specifies alternative uses.

The topmost level in the RDL structure is a UNIT. A UNIT describes a hierarchical composition of other UNITs and RESOURCEs. Each UNIT is declared using the UNITDEF keyword. The syntax of UNITDEF is shown below:

list_of[ PARAMETER <parameter-name> INTEGER ;]

UNITDEF <unit-name> { list_of[ %extern% RESOURCE <resource-name> resource-instances ]

list_of[ %extern% UNIT <unit-name> unit-instances ; ]

connection-specifier

%list_of[ uses-specifier]%

} resource-instances : <resource-instance-name>%[ INTEGER ]%;

unit-instances : <unit-instance-name>%[INTEGER]%;

connection-specifier :

list_of[ RCONNECT( resource-instance, resource-instance, resource-instances ); ]

OR list_of[ for( i = INTEGER ; i < INTEGER ; i= i+ INTEGER){ list_of[ RCONNECT( resource-instance, resource-instance, resource-instance ); ]

} ]

OR list_of[ for( i = INTEGER ; i< INTEGER ; i= i+ INTEGER)
{ list_of[ if( arithmetic-expression ){ list_of[ RCONNECT( resource-instance, resource-instance, resource-instance );]

} ]

} ]

uses-specifier :
    USES( resource-instance, resource-instance );

OR list_of[ for( i = INTEGER ; i < INTEGER ; i= i+ INTEGER)
{ list_of[ if( arithmetic-expression ){ list_of[ USES( resource-instance, resource-instance );]

} ]

} ]

Illustration 1

An example of a UNIT definition is given below to illustrate the use.

PARAMETER N 10

UNITDEF my_unit {
    RESOURCE ADDER my_adders[N];
    RESOURCE TRISTATEBUS bus ;
    UNIT MEMORY local_memories[N/2];

```
for( i = 0 ; i<N/2 ; i=i+1 )
}
RCONNECT( myadder[I], local_memories[i/2], bus);
}
}
}
```

All the units and resources declared inside a UNITDEF definition indicate that the declared units/resources are a part of the unit that is being currently defined. The for loop construct along with the if construct and arithmetic expressions provide a versatile way to specify arbitrarily complex connections concisely. The arithmetic expressions for the if condition can consist of the loop index variable and integers, and arithmetic and logical operators listed in Table 1. Next, the RESOURCE construct is defined.

After UNIT, the next level in the RDL structure is the resource. A resource indicates a basic hardware unit that provides a set of functionalities. A resource is defined using the RESOURCEDEF construct, the syntax of which is shown below:

```
RESOURCEDEF <resource-name> {
   list_of[ FUNCTIONALITY <functionality-name> ; ]
   list_of[ ATTRIBUTE <attribute-name> : attribute-specifier]
}
```

The list of functionality names provided in the RESOURCEDEF definition for a particular resource describes to the compiler the functionalities provided by that resource. The functionality names could be the names corresponding to the basic operators (Table 1), for example, ADD if the resource supports addition; or, advantageously, flexibility is provided to define complex functionalities by aggregating the basic functionalities via the FUNTIONALITYDEF construct (described herein).

Illustration 2

For example, a set of 8 identical resources (called CUs, and which can perform different operations such as add, multiply, multiply-accumulate etc.) can be defined as:
   RESOURCE CU my_cus[8];

Suppose for illustration, the CUs can handle 8-bit additions. Also, suppose for illustration that 2 CUs can be chained together to create an adder to perform a 16-bit adder.

A new resource can be described which can perform a 16-bit addition as follows:
   RESOURCEDEF ADDER16 { }

Then, 4 16-bit addresses can be instantiated using the RESOURCE construct as illustrated below:
   RESOURCE ADDER16 my16adders[4];

This case is followed by the USES construct (defined herein) to indicate that each 16-bit adder uses 2 adjacent CUs from the array of 8 CUs.

```
For( I = 0 ; I<4 ; I = I + 1 )
{
   USES( my32adders[I], my_cus[2*I]);
   USES(my32adders[I], my_cus[2*I+1]);
}
```

The functionality definition mechanism is a way in RDL to combine the basic operators together in a structural form to describe aggregate functionality. An already-defined functionality can also be aggregated to define new functionality. For each of the basic operators that are binary, the two inputs are referred to as left_in and right_in. The output is referred to as out. For unary operators the input is referred to as in and the output as out. A new functionality can be defined by first defining a set of input and output nodes, a set of basic operator nodes, and then specifying the connection between these nodes via the DCONNECT construct (described herein). The syntax of FUNCTIONALITYDEF construct is as follows:

```
FUNCTIONALITYDEF <functionality-name> {
   list_of[ INPUT <input-names> ; ]
   list_of[ OPT_INPUT <input-names> ; ]
   list_of[ OUTPUT <output-names> ; ]
   list_of[ OPT_OUTPUT <output-names> ;]
   list_of[ FUNCTIONALITY <functionality-names> ; ]
   list_of[ DCONNECT( <output-instance-name>, <input-instance-name> ); ]
}
```

Illustration 3

The following is the definition for the multiply-accumulate functionality:

```
FUNCTIONALITYDEF mac {
   Input a , b , c ;
   Output d ;
   ADD adder;
   MULT multiplier ;
   DCONNECT( a , adder→left );
   DCONNECT(b, adder→right );
   DCONNECT( adder→out, multiplier→left );
   DCONNECT( c, multiplier→right );
   DCONNECT(multiplier→out, d ); }
```

The DCONNECT construct connects the output of a node to the input of another. The nodes are defined by basic operator names or as input/output nodes. Along with basic operator nodes, defined functionality nodes can also be used. If defined functionality nodes are used, then the names of the input/output are derived from the corresponding functionality definition.

The FUNCTIONALITYDEF construct is used to specify library functions specified in a high-level language (e.g., MATLAB) as a functionality. To define such functionalities, the input and output lists are specified. The advantage of this capability is the ability to define functions which are mapped to hardware, and then used by the application mapped to the overall architecture.

Illustration 4

For example, to define functionality of library function that performs fast fourier transform (fft):
   A = fft ( b );
   FUNCTIONALITYDEF is used as follows:

```
FUNCTIONALITYDEF fft {
   Input a ;
   Output b ;
}
```

The semantics and order of the arguments for function call are derived from the convention of calling the function from the underlying high-level language (for example, in MATLAB it could be a built-in function or a .m file).

The OPT_INPUT and OPT_OUTPUT keywords (described herein) are provided to specify optional input and output arguments to such functions. The optional arguments for the library function calls are denoted by the OPT_INPUT/OPT_OUTPUT constructs to represent compactly the library functions with optional arguments.

In the following, other keywords and constructs that are part of RDL are defined:

RCONNECT: The RCONNECT keyword denotes the connection of two resources, an origin resource and a destination resource, via a third resource, the connecting resource. The use of RCONNECT is illustrated in Illustration 1.

USES: The USES keyword is used to indicate other resources used by a particular resource. For example, the construct is useful for defining virtual resources that build on physical resources defined as part of the architecture. This construct is illustrated in Illustration 2.

DCONNECT: The DCONNECT keyword is used to connect basic operators in order to construct new functionalities. DCONNECT is illustrated in Illustration 3.

INPUT: The INPUT keyword defines input nodes for constructing new functionalities. INPUT keyword is illustrated in Illustration 3.

OUTPUT: The OUTPUT keyword defines output nodes for constructing new functionalities. OUTPUT is illustrated in Illustration 3

OPT_INPUT: The OPT_INPUT keyword specifies optional input nodes for constructing new functionalities.

OPT_OUTPUT: The OPT_OUTPUT keyword specifies optional output nodes for constructing new functionalities.

if: The if construct along with the for construct makes it easy to specify arbitrarily complex connection between resources.

for: The for keyword is used to write loops in the architecture descriptions. The loops are convenient for describing large repetitive structures in the architecture.

FIG. 2 illustrates a pipelined multiplier, its interface and its throughput and latency using RDL. It also describes the use of several components of the RDL above. Furthermore, it illustrates one manifestation of an IP-core using RDL. It describes a 16×16 multiplier for unsigned data. The multiplier is specified as a resource; a compiler that using this multiplier can instantiate it as a resource within a design. The interface using the ATTRIBUTE INSTANTIATION specification describes to the compiler how the multiplier can be used. The throughput and latency (timing behavior) of the multiplier are described using the attribute PIPEDELAY and NUM_OF_STATES. This example is one embodiment of the multiplier.

The specification of the multiplier can be in any language at different levels (e.g., Verilog, VHDL etc.,) and remain internal to the specification. The interface and attributes with the timing characteristics in terms of throughput and latency are sufficient to use and instantiate the multiplier. The interface CAN_DO specifies all the functionalities that this multiplier in particular (and an IP-core in general) can perform. The manner in which this is done remains independent of the specification and internal to the specification.

ATTRIBUTE INTERFACE illustrates one manifestation of the instantiation of this multiplier (this describes the internals of what a synthesis compiler can do to instantiate this compiler). The interface can also specify area and resource usage of the IP-core, which can be used by the synthesis compiler for instantiation and optimizations.

FIG. 3 demonstrates the specification and interface to accumulate data with variable latency. The interface for this case is shown in the ATTRIBUTE Interface of the specification. This figure also demonstrates how specification of a variable latency adder is provided using one embodiment of the RDL.

FIG. 4 illustrates an accumulator specification and its interface, where the accumulator is capable of accumulating N input values, where N is an input parameter. The compiler can understand via this specification the accumulator's timing behavior, which depends on an input parameter. Therefore, using this interface, the compiler can synthesize suitably an interface to use this accumulator within the overall synthesis of the application by appropriately generating the synchronization that is needed.

The following describes the processing of RDL and its compilation. One embodiment of the RDL processing and compilation is shown in FIG. 1. The architecture of the target is presented as an input (Block 1). The design and features of the target are described using RDL (described herein). RDL design is parsed and validated for syntax correctness. RDL design is transformed into an Abstract Syntax Tree (AST), which stores the features, characteristics, and interconnects of the components of the target (Block 2). The RDL is powerful enough to capture current and future target architectures. Block 2 takes in as input a single RDL description of the target architecture and creates an intermediate graph representation of the architecture so as to perform optimizations.

Information about the target architecture to compile it can be inferred from the intermediate storage. The RDL AST is used as an intermediate storage of information that was parsed in from the RDL file. The advantage is not only in ease of translation to the RDL graph, but also, in ease of writing the RDL file (Block 3). Hence, there needs to be a compiler pass, which will not only parse in the RDL description of the architecture, but create an architecture graph which can be easily queried by the compiler. The architecture graph has nodes that correspond to the hardware resources in the target architecture and edges to the actual interconnections between these resources. Each resource should have a graph for all functions that it can perform. Since the target architecture for the compiler can be different, the architecture and functionality graphs is created as they are required.

The RDL Compiler described herein gives a detailed view of all these tasks which involve parsing in a RDL file, storing it in an intermediate format and dumping a C++ file (resource.cpp) which is the preferred compiler to create an architecture and functionality graph. This interface facilitates the flow of information between the compiler and the architecture, which enables the Scheduling and IP Core Integration pass to realize fully the optimization features in hardware and take scheduling and allocation decisions accordingly.

The resource instances or unit instances (inside the Unit Definition) can be simple multi-dimensional arrays with the indices as any non-assignment expressions. The array indices can be expressions that can be determined, as in binary expressions involving constants and macros defined in the RDL using the PARAMETERDEF clause.

The RCONNECT statement includes at least three resources: the source resource, the target resource, and the edge resource. In case the number of resources is greater than three, then it is interpreted as a BUS architecture in which the last resource is an edge connecting all the other resources.

The USES statement should have at least 2 resources, the first one being the virtual resource being constructed followed by the list of actual physical resources used up by the virtual resource.

A database for storing area/delay information based upon certain parameters like the bitwidth etc. can be used. This is done thru the table class in the RDL.

One RDL parse d in RDL AST is created. The following case is an embodiment of the RDL AST. RDL AST is used as an intermediate storage for the data parsed in from the RDL file for the target architecture. The class structure for the RDL AST is:

BasicNode
{
}
SymbolTableEntry : BasicNode
{
}
ParameterEntry : SymbolTableEntry
{
string p-name;
int p-val;
}
FunctionalityEntry : SymbolTableEntry
{
string f-name;
list<FuncDeclr * > * ports;
list<FuncDeclr * > * internal-nodes;
list<Dconnect * > * Dconnectlist ;
}
FuncDeclr : BasicNode
{
string node-type;
string node-name;
}
FuncConnect : BasicNode
{
string origin;
string target;
}
ResourceEntry : SymbolTableEntry
{
string r-name;
list<string> * funclist;
list<Attribute *> * attributelist;
}
Attribute : BasicNode
{
string a-name;
list<FuncAttribute *> * funcattributelist;
FuncAttribute : BasicNode
{
string f-name;
list<string> * cminuscode;
}
UnitEntry: SymbolTableEntry
{
string u-name;
list<Declarations *> * declrlist;
list<Statements *> * stmtlist;
}
Declarations : BasicNode
{
bool external;
int type;
string ResourceName;
list<Composite *> * instancelist;
}
Composite: NonAssignExpr
{
}
CompositeName : Composite
{
Composite * BeforeArrow;
Array * AfterArrow;
}
Array : Composite
{
string name;
list<ArithExpr *> * indices;
bool is-function;
}
FloatingClass : NonAssignExpr
{
float fval;
}
IntegerClass : NonAssignExpr
{
int ival;
}
StringClass : NonAssignExpr
{
string sval;

```
}
LogicalExpr : NonAssignExpr
{
NonAssignExpr * lhs;
NonAssignExpr * rhs;
enum LogOp logop;
}
ArithExpr : NonAssignExpr
{
ArithExpr * lhs;
ArithExpr * rhs;
enum ArithOp arithop;
{
AssignExpr : Statement
}
Array * lhs;
ArithExpr * rhs;
}
NonAssignExpr : Statement
{
}
Statement : BasicNode
{
}
IfStmt : Statement
{
LogicalExpr * lhs;
list<Statements *> * if-body;
list<Statements *> * else-body;
}
ForStmt : Statement
{
AssignExpr * start;
AssignExpr * end;
LogicalExpr * cond;
list<Statements *> * body;
}
RconnectStmt : Statement
{
list<Composite *> * orig-target;
Composite * connecting-resource;
}
UseStmt : Statement
{
list<Composite *> * used-resources;
```

Composite * virtual-resource;
}

Once the RDL file is parsed in and stored in an intermediate AST, the RDL graph creation pass traverses the RDL AST, and outputs a C++ file, which when invoked by the synthesis compiler (e.g., so-called Accelchip compiler), returns a graph of the target architecture. This graph represents a list of target architecture resources (compute resource, communication resource and storage resource) and the interconnection between these resources. It also provides information on the possible usage of the resources (i.e., the functionalities supported,) and the attributes associated with a resource. The functionalities are also specified in the form of a functionality graph. The RDL graph creation pass is a rule-based pass, which generates C++ lines for every construct in the RDL AST. The list of these rules is mentioned in the order in which they are to be processed.

The graph construction routine and the table data structures to be used in creating databases that store the capabilities and characteristics of resources to be used with the RDL resource attributes are under a ResourceGraph C++ namespace. This is compiled with the RdlGraph namespace having the datastructures for the resource and the functionality graph.

The resource.cpp file creates a list of functionality graphs, where each graph corresponds to a FUNCTIONALITYDEF in the RDL file. In the creation of this graph, each Port or Node instantiation in the RDL is translated to a node in the functionality graph and each DCONNECT statement is translated to an edge in the functionality graph.

The resource.cpp file also creates a resource graph. Each instantiation of a resource in the RDL thru the RESOURCE statement is translated to a node in the graph, while an RCONNECT statement is translated to an edge in the graph.

The attributes to a resource are translated to functions in the resource.cpp file. In one embodiment of the compiler, Applications written in a high-level language are compiled into an intermediate format called Mach Intermediate format (MIF). MIF is represented in an AST. These functions take in as input a Wrapper, which contains information of the operands to the MIF AST. It has a map of the variables in the MIF AST, which are to be port mapped to the functionality graphs for the supported functionalities of a resource. It also has a list of Application Programming Interface (APIs), which are provided to the RDL writer to access all information about the variables in the MIF AST. These attribute functions return an Attribute class, which is basically a string to be interpreted by the client of the RDL compiler.

Each FunctionalityEntry in the RDLAST is converted to a FunctionalityEntry node in the C++ file generated. The functionality graph generation is a two-pass process. In the first pass, even macro functionalities like MAC embedded inside a functionality definition as an internal node are stored as a BasicNode. A later pass flattens the functionality graph so that basic operators that are recognized from the Mach Intermediate Format (MIF) AST are present. This flattening allows a user to create functionality definition types, and use these for declaring more complex and larger functionalities in an easier manner. The functionality graph has a list of nodes, which are the input/output ports and a list of nodes, which are the internal nodes of the graph. Functions with only input/output ports qualify IP cores or basic operators.

The Functionality Graph has a pointer to all the resource definitions which support this particular functionality. Each ResourceEntry in the RDLAST (a Resource Definition) gets converted to a ResourceDef in the C++ file generated. This class has a pointer to the list of functions supported by the resource, and a pointer to the list of instances of this resource (i.e., a pointer to the list of graph nodes in the resource graph).

A UNITDEF is provided in the RDL to associate a set of resources together and instantiate them. RDL compiler maintains this hierarchy information. The list of unit instances is placed over the resource graph, which maintains the resource hierarchy created by the user. Each unit instance points to a set of resources inside it, and points to a list of other unit instances in a hierarchical manner.

The unit graph has a top-level unit node which points to a list of resources and other unit instances inside it. Hence, it is required that the RDL file has only one UNITDEF statement, which is not instantiated in other UNITDEF statements, and is the top-level architecture. A major advantage of maintaining both the flattened graph and the hierarchical graph is that RCONNECT statements which might have the names of the source, sink, and edge resources pointing to multiple levels of hierarchy, can be translated to actual edges in the flattened graph.

Each declaration inside the UNITDEF statement is converted to either a resource node in the flattened resource graph (the RESOURCE declaration), or a unit node in the hierarchical unit graph (the UNIT declaration).

The for and if statements in the UNITDEF statements are for creating the RCONNECT statements and are directly written into the resource.cpp file.

RCONNECT statements have a source, sink and connecting resource. The names for the source, sink and edge resources can point to multiple levels of hierarchy, and are extracted by traversing the hierarchically created Unit graph.

The mapping of application code (synthesis to target) entails optimally matching and mapping operators and functions to the resources so as optimally to use resources, while maximizing performance. To achieve this, one embodiment of the matching process entails graph matching as illustrated in FIG. 1. The high-level algorithm block entails the following steps:

Using the construct "Create table", a table containing properties of resources and IP-cores is created.
The table is populated with the characteristics of all functions and IP-cores.
Earlier illustrations and FIGS. 2-4 illustrate the architecture interface and IP-core specifications.
Using querying capabilities to the database containing IP-cores and resource information, which may involve complex equations, compiler is returned area, performance characteristics of a function block or an IP-core.
These characteristics are used optimally to compile the application by optimized mapping onto resources.

The first step in mapping involves functionality matching. This involves matching portions of the input application with the functionality provided by the optimized components. Matching algorithm in this embodiment performs a directed search to use the complex components by focusing on the operators on the critical path and tries to cover them with the complex components. A string-matching based algorithm described next is used to search the complex components. The matching is performed differently for components and basic operators and blocks.

For operators and components, the operand association derived from the matching of the graphs gives the information regarding which variables in the AST are assigned to which signals of the component. The first step in using optimized components is to recognize its functionality. To specify the functionality of a component a dataflow graph corresponding to the functionality of the component is constructed. Operations in the input application are then mapped to the components in a two-step process. First the input application is parsed to construct an Abstract Syntax Tree (AST). A graph-matching algorithm is then used to match parts of the AST with the dataflow graphs of the components. An example of a dataflow graph is illustrated in FIG. 5.

This figure illustrates that multiple data flow graphs must be specified for the multiply and accumulate component to ensure that both the expressions (i) and (ii) are covered. This embodiment of the compiler generates all specifications to enable matching.

This embodiment of the graph-matching algorithm constructs a unique signature from the dataflow graph specification of a component. It then constructs a signature for part of the AST for which a component is sought. To construct the signature a breadth first traversal of the graph is done starting from the output node as root. If more that one output node is present, a dummy node is made the parent of all output nodes. The signature is then constructed by combining recursively the signatures of intermediate nodes of the graph, starting with the leaves of the BFS tree. The signature of a node is the symbol of the node concatenated with the signatures of its children. The symbol of a leaf node is a label that denotes an input. For the AST signature, the leaves are labeled with the variable names. The signatures of the children are ordered lexicographically with the leaf labels matching any other leaf label. The signature construction algorithm is specified by the following recursive formula:

$$sig(node) = \begin{cases} \text{if } op(node) \text{commutative, } sym(node)[greater-sig(child)] \\ [smaller-sig(child)] \\ \text{else } sym(node)[sig(left-child)][sig(right-child)] \end{cases}$$

sig( node): signature of the node.
sym( node): symbol for the node.
op(node): operation performed by the node.

The greater-sig and smaller-sig refer to the greater and the smaller signature among the children, where the ordering is defined by lexicographical comparisons. In this embodiment of the matching process, the signature is a parenthesized postfix notation of the operand tree taking commutativity into account.

The operand matching process works by constructing the signatures for the portion of the application covered and the functionality against which it is being checked. Since lexicographical comparison is at the base of signature comparisons, the signatures for all the operators can be sorted, enabling an efficient binary search.

To construct back a tree from a given signature, the following method is used: for a given signature, use the symbol to construct the node, the first parenthesis for the left child and the second parenthesis for the right child. This algorithm by definition produces a unique tree corresponding to a given signature.

For IP-cores and block matching, the match is based on keywords such as the algorithm implemented by the block (e.g., FFT, VITERBI etc). The responsibility of generating all the control signals correctly and producing the appropriate interface is pushed to the interface generator corresponding to the IP block, which is part of the RDL compilation. The compiler passes the operands and gets back a graph of the IP-core. For Interface generation, in this embodiment, the compiler uses the interface generator for the component (which is part of RDL compilation). The compiler queries the interface generator of a component for the HDL code by passing it the operand associations (obtained by string matching as described previously).

The interface generator responds with the necessary HDL in the form of a graph. Each node of the graph has one or more HDL statements. The edges of the graph are directed and denote the number of clock cycles that must elapse between the statements of the two nodes. Along with the graph the interface generator also provides the minimum clock period at which the interface is valid. Following the above process, the synthesized application, on the target, has the appropriate HDL interface to invoke the IP-cores and function blocks. Note following Appendix illustrates RDL grammar example.

To illustrate foregoing concepts, the Resource Description Language description for Xilinx XC2V250 FPGA system is presented in Appendix B.

What is claimed is:

1. A computer-automated method for electronic design specification comprising:
   obtaining a target architecture defining a plurality of hardware resources;
   describing the plurality of hardware resources for the target architecture using at least one construct in a Resource Description Language (RDL) to produce an RDL description;
   generating an intermediate graph representation from the RDL description, the intermediate graph representation storing features and characteristics of the plurality of hardware resources and interconnects between the plurality of hardware resources;
   traversing the intermediate graph representation;
   invoking results of the traversing step using a high-level synthesis compiler to generate a functionality graph and resource graphs for the target architecture; and
   mapping application code onto the plurality of hardware resources using the functionality graph and the resource graphs.

2. The method of claim 1 wherein:
a resource is used to specify an architecture and a plurality of functionalities.

3. The method of claim 1 wherein:
a unit is used to specify a hardware structure comprising a hierarchical representation of one or more hardware structure.

4. The method of claim 1 wherein:
a UNITDEF value defines or describes a hierarchy of a unit.

5. The method of claim 1 wherein:
a RESOURCEDEF value defines a resource among a set of functionality or associated property.

6. The method of claim 1 wherein:
a RCONNECT value denotes a connection between an origin resource and a destination resource via a connecting resource.

7. The method of claim 1 wherein:
a USES value indicates one or more resource used by a particular resource, the USES value defining at least one virtual resource for building at least one physical resource in an architecture.

8. The method of claim 1 wherein:
a FUNCTIONALITY value specifies a set of one or more basic operator to provide a functionality.

9. The method of claim 1 wherein:
a FUNCTIONALITYDEF value defines a composition of a new functionality.

10. The method of claim 1 wherein:
a DCONNECT value connects a plurality of basic operators while constructing a new functionality.

11. The method of claim 1 wherein:
an INPUT value specifies one or more input node for constructing a new functionality.

12. The method of claim 1 wherein:
an OUTPUT value specifies one or more output node for constructing a new functionality.

13. The method of claim 1 wherein:
an OPT_INPUT value specifies one or more optional input node while constructing a new functionality.

14. The method of claim 13 wherein:
a hierarchy traversal operator (→) specifies a unit or resource embedded within one or more units by specifying a chain of units hierarchically with the → operator denoting a child-parent relationship in a hierarchy.

15. The method of claim 13 wherein:
an array operator ([ ]) specifies an array or collection of one or more resource or unit.

16. The method of claim 13 wherein:
a comment operator (//) inserts one or more comment in an architecture file.

17. The method of claim 13 wherein:
operators +, −, *, /, %, =, !=, >, >=, <, and <= comprise a set of arithmetic or logical operators for constructing one or more expression for use with an if construct selectively to make one or more connection in a for loop.

18. The method of claim 1 wherein:
an if value specifies an arbitrarily complex connection between a plurality of resources in conjunction with using a for value.

19. The method of claim 1 wherein:
a for value specifies an arbitrarily complex connection between a plurality of resources in an architecture.

20. The method of claim 1 wherein:
at least one operator in a resource design language (RDL) specifies a hardware and a processing of the hardware.

* * * * *